United States Patent [19]

Vella-Coleiro

[11] Patent Number: 5,469,467
[45] Date of Patent: Nov. 21, 1995

[54] METHOD FOR SYNCHRONIZING THE REFERENCE FREQUENCY OSCILLATOR OF A METALLIC-BASED MICROCELL TO A MASTER OSCILLATOR

[75] Inventor: George P. Vella-Coleiro, Summit, N.J.

[73] Assignee: AT&T Corp., Murray Hill, N.J.

[21] Appl. No.: 138,583

[22] Filed: Oct. 15, 1993

[51] Int. Cl.[6] .................... H04L 7/00; H04B 7/00
[52] U.S. Cl. .................. 375/358; 375/354; 375/356; 455/51.2; 455/69
[58] Field of Search .................... 375/106–109, 375/111; 370/17, 100.1, 103, 104.1, 108; 455/33.1, 51.2, 69, 71, 51.1

[56] References Cited

U.S. PATENT DOCUMENTS

| | | | |
|---|---|---|---|
| 4,800,560 | 1/1989 | Aoki et al. | 370/104.1 |
| 5,257,404 | 10/1993 | Goreham et al. | 455/51.2 |
| 5,261,118 | 11/1993 | Vanderspool, II et al. | 455/51.2 |
| 5,280,629 | 1/1994 | Lo Galbo et al. | 455/51.2 |
| 5,363,376 | 11/1994 | Chuang et al. | 375/107 |

FOREIGN PATENT DOCUMENTS

| | | |
|---|---|---|
| 2829651 | 1/1980 | Denmark. |
| 3042808 | 6/1982 | Denmark. |
| 5972124 | 10/1995 | Japan. |
| 2000651 | 1/1979 | United Kingdom. |
| 2100890 | 6/1983 | United Kingdom. |
| 9307681 | 4/1993 | WIPO | 455/51.2 |
| 9307682 | 4/1993 | WIPO | 455/51.2 |

OTHER PUBLICATIONS

J. Levine, et al., "The NIST Automated Computer Time Service", Journal of Research of the National Institute of Standards and Technology, (Sep.–Oct. 1989), vol. 94, No. 5, pp. 311–321.

W. D. Grover and T. E. Moore, Precision Time–Transfer in Transport Networks Using Digital Crossconnect Systems, IEEE Global Telecommunications Conference & Exhibition, Nov. 28–Dec. 1, 1988.

Primary Examiner—Young Tse

[57] ABSTRACT

The present invention involves a device for synchronizing the broadcast frequency of a base station and a microcell linked together by a metallic medium as well as a method for using the device to synchronize the base oscillator and the microcell oscillator. The device comprises a base transmitter which transmits a base time-of-day signal to a microcell comparer, and a microcell clock which sends a microcell time-of-day signal to the microcell comparer. A microcell oscillator provides the microcell clock with a reference frequency. The microcell comparer calculates a time difference which represents a time difference between the base time-of-day signal and the microcell time-of-day signal. The microcell comparer then outputs a correction signal to a digital controller. The digital controller adjusts a microcell oscillator according to the correction signal.

20 Claims, 3 Drawing Sheets though the article states that empirical evidence indicates reciprocity in telephone paths, it also maintains that the lack of perfect reciprocity may prove to be the ultimate limitation in the system.

METHOD FOR SYNCHRONIZING THE REFERENCE FREQUENCY OSCILLATOR OF A METALLIC-BASED MICROCELL TO A MASTER OSCILLATOR

BACKGROUND OF THE INVENTION

1. Field of the Invention

The present invention relates generally to a device and the method to synchronize timers. More specifically, the invention relates to the device and the method to synchronize a master oscillator located at a base station and a slave oscillator located at a microcell. Such synchronization facilitates simulcasting of radio frequency channels.

2. Information Disclosure Statement

A method of synchronizing clocks is taught in the prior art in J. Levine et al., "The NIST Automated Computer Time Service," *Journal of Research of the National Institute of Standards and Technology* Vol. 94, Number 5, p. 311 (September–October 1989). In that article, the authors explain the Automatic Computer Time Service (ACTS) which is a telephone time service designed to provide users with telephone access to time generated by the National Institute of Standards and Technology (NIST).

The article cites the principle limitation of time dissemination as being the uncertainty in the velocity of the propagation of the information through the medium separating the transmitter and the receiver. The delay, typically in the order of milliseconds, depends upon the physical length of the path and on the group velocity of the signal. Generally, neither of these parameters is known. Consequently, to achieve the highest degree of synchronization, real time measurements of the transit time must be taken.

The delay can be determined by measuring the time duration between transmitting a pulse to the user and receiving an echoed pulse. Half of this round trip delay is the time required for the signal to reach the user assuming that the communication medium is reciprocal. Although the article states that empirical evidence indicates reciprocity in telephone paths, it also maintains that the lack of perfect reciprocity may prove to be the ultimate limitation in the system.

To achieve this millisecond synchronization of computers, the NIST has developed a simple telephone system for the automated setting of clocks in digital systems. NIST has developed software to facilitate automatic dialing, selecting a time zone, selecting a mode of operation, echoing the on-time marker (OTM), setting of the computer clock, archiving of clock off-set, and transmitting a signal to the parallel port of a computer, which can be used to produce an external time pulse coincident with the OTM. Additionally, the article provides diagrams of simple circuits to convert the signal sent to the printer port to a positive pulse. The article also details a circuit that echoes all characters from the user and provides an external pulse when the OTM is received. This circuit requires a modem but does not require a computer.

The article basically focuses on the application of ACTS for the maintenance of accurate time within a digital computer. For example, the article suggests tagging business transactions or scientific data with the exact time. Such tagging becomes particularly useful where a multiplicity of computers independently tag events, and thus require a common time standard. Additionally, the article mentions a second application aimed at the measurement of frequency. In this application, the pulses coincident with the OTM are used to start and stop a counter. The counter counts the output of the oscillator under the test. By comparing the pulses to the counts, an oscillator can be calibrated using exact time. The system can be used to set digital clocks, or to perform frequency calibrations at an accuracy of one part in $10^8$ for a one day period.

The article also speculates on the future development of the system and the new products which it might spawn. It suggests a digital clock comprising a microprocessor incorporated into a phone receiver. To maintain exact time according to the National Institute of Standards and Technology, the clock would access the ACTS via the telephone. Such a phone could be networked to other phones in a school or factory to provide the exact time throughout the organization. Additionally, the article suggests automatic calling to enable the user to call during less expensive non-peak hours.

Thus, the article limits the application of the method of synchronization to time—both in the maintenance of accurate clocks and the calibration of frequency oscillators. The prior art lacks motivation to use the synchronization method in telecommunications. More specifically, the article does not suggest that the ACTS could be modified to enable a base station and a microcell to simulcast.

SUMMARY OF THE INVENTION

The present invention is directed at enabling a base station and a microcell to simulcast. In particular, the present invention is aimed at synchronizing the oscillators located at the base station and the microcell when the two stations are joined by a metallic medium.

One object of the invention is to provide a configuration of circuitry which synchronizes the oscillator of the base station with the oscillator of the microcell. By synchronizing the oscillators, the RF carriers synthesized at both the base station and the microcell will have the same frequency, thus facilitating simulcasting. Another object of the invention is to compensate for the transmission delay before the base station transmits a time-of-day signal. Such compensation would not only facilitate simulcasting by providing the microcell with a real time reference, but also provide an absolute time standard for other functions at the microcell.

Yet another object of the invention is to provide a method for synchronizing the oscillators by maintaining a constant time delay between the transmission of the base station time-of-day signal and the microcell time-of-day signal. By maintaining a constant delay, the transmission delay between the base station and the microcell is negated, and the oscillators remain synchronized. Thus, simulcasting is facilitated.

Still another object of the present invention is a method to adjust the base station's time-of-day signal to compensate for the time delay before it is transmitted to the microcell. In this way, a real time reference is available to the microcell which enables it to simulcast.

Therefore, the present invention teaches the circuitry required, as well as the method, to enable simulcasting of a base station and a microcell linked together by a metallic medium.

BRIEF DESCRIPTION OF THE DRAWINGS

For a fuller understanding of the nature and object of the invention, the reader should take note of the detailed description taken in connection with the accompanying drawings in which.

DETAILED DESCRIPTION OF THE PRESENT INVENTION

In some applications of microcells known as simulcasting, it is necessary to transmit the same radio frequencies (RF) channels at the microcell site as those being transmitted at the base station. In areas where the RF signals overlap, mobile telephone units may receive both signals. Even a slight frequency difference between the signals is intolerable due to the beat notes produced. In a microcell system using optical fiber as the transmission medium between the base station and the microcell site, simulcasting is not a problem. The fiber can accommodate an extremely wide band width, thus making it possible to transmit the RF channels generated at the base station to the microcell site unmodified. In areas where fiber is not available or is too expensive to install, it would be advantages to use a metallic transport medium such as T1.

The problem with T1, however, is that due to its limited band width, a RF signal cannot be transported unmodified from the base station to the microcell. Instead, the RF signal—a voice or data transmission—is modulated into an RF carrier generated at the microcell site. At both the base station and the microcell site, the RF carriers are synthesized using a reference frequency generated by an oscillator. However, to keep the microcell equipment small and inexpensive, it is impractical to use a high stability oscillator as is used at the base station; rather, a less expensive crystal reference oscillator is used. Some means is therefore needed to synchronize a crystal reference oscillator at the microcell site with the master oscillator at the base station. The present invention provides these means.

Figure 1:
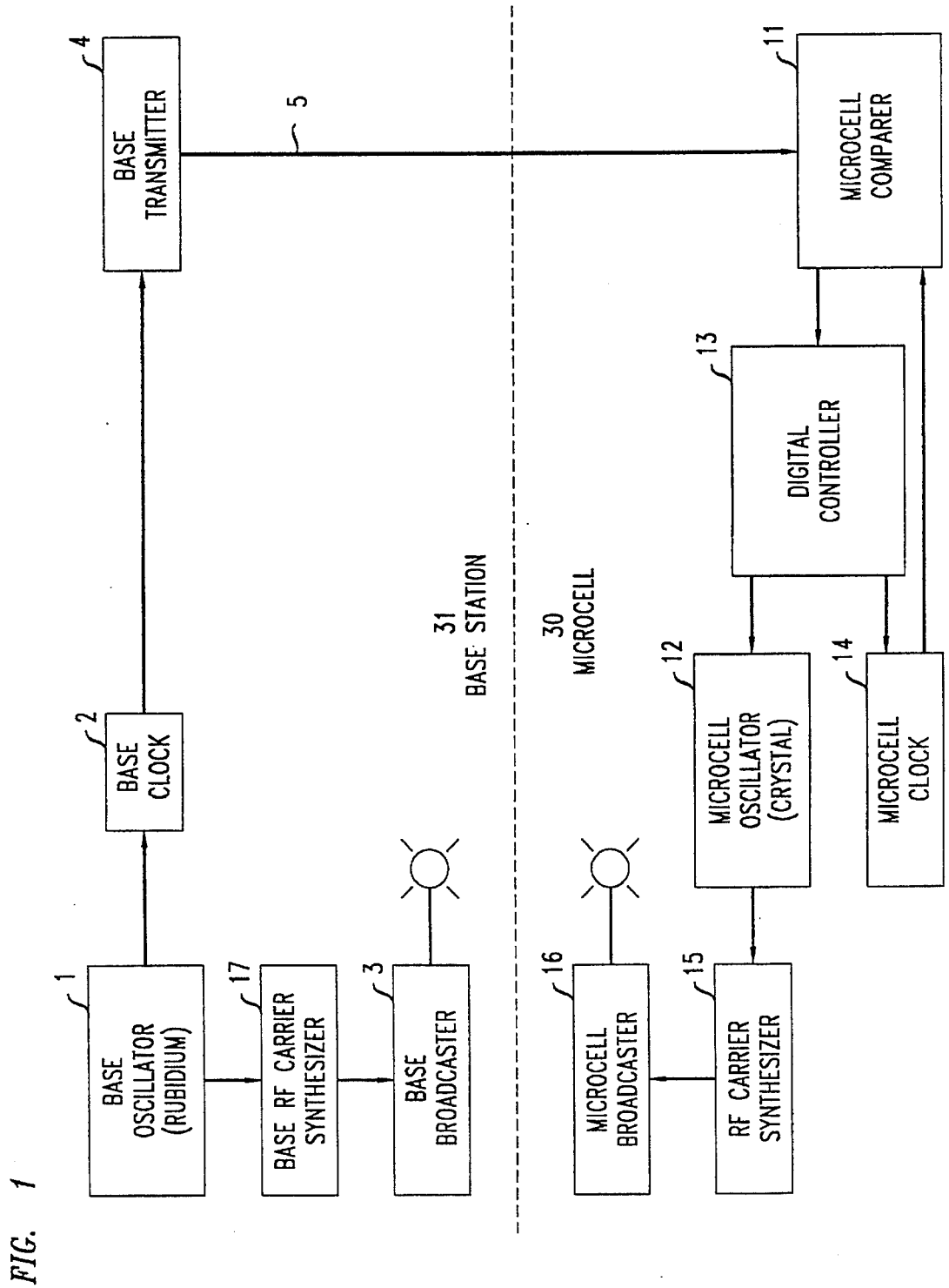
FIG. 1 depicts a preferred embodiment of the present invention.

Referring now to FIG. 1, the schematic shows the present invention which enables a base broadcaster 3 and a microcell broadcaster 16 to "simulcast." Simulcasting, or broadcasting at the same frequency, requires synchronization of a base oscillator 1 located at a base station 31 and a microcell oscillator 12 located at a microcell 30. Base oscillator 1—which is typically a high stability oscillator such as rubidium—provides a reference to a base RF carrier synthesizer 17, and a base clock 2 which outputs a base time-of-day signal. Microcell oscillator 12 is a crystal oscillator which can be adjusted by a digital controller 13 containing a microprocessor. The output of microcell oscillator 12 is used as a reference frequency for both a microcell RF carrier synthesizer 15, and a microcell clock 14 which outputs a microcell time-of-day signal.

Base clock 2 periodically sends the base time-of-day signal to a base transmitter 4 which transmits it over metallic link 5 to microcell 30. At microcell 30, the base time-of-day signal is compared with the microcell time-of-day signal in a microcell comparer 11. Microcell comparer 11 periodically monitors the signals and calculates the time difference between the two signals. This time difference represents the accumulated error between base clock 2 and microcell clock 14 plus the transmission delay between base transmitter 4 and comparer 11. Since metallic link 5 imputes a constant transmission delay, the time difference should remain constant if base oscillator 1 and microcell oscillator 12 are synchronized. If, however, the time difference changes, the oscillators are not synchronized.

Figure 3:
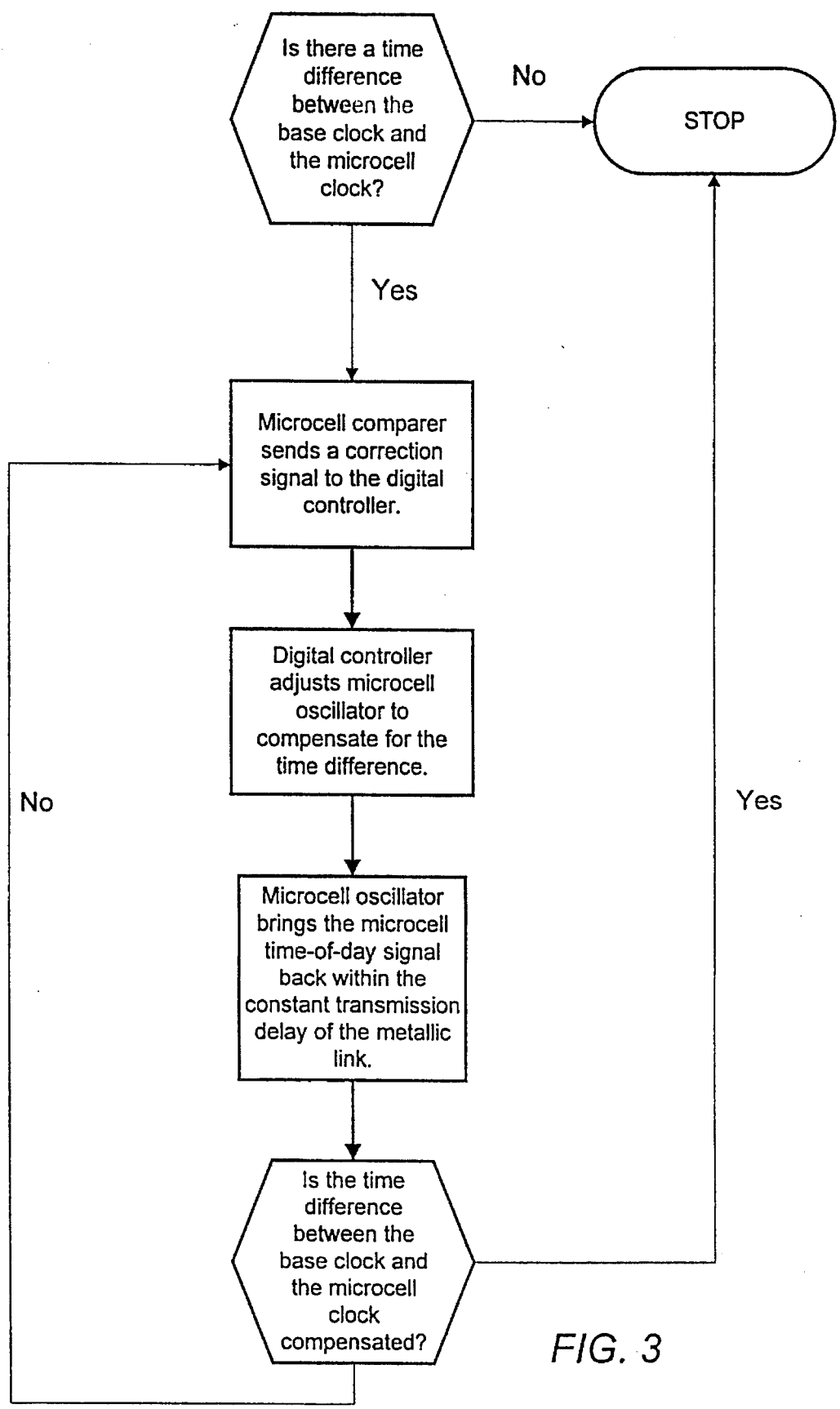
FIG. 3 illustrates how the time difference between the base clock and the microcell clock is compensated.

The change in time difference can be used to adjust microcell oscillator 12 as shown by FIG. 3. More specifically, microcell comparer 11 sends a correction signal to digital controller 13 corresponding to the time difference change. Digital controller 13 in turn adjusts microcell oscillator 12 to bring the microcell time-of-day signal back within the constant transmission delay of metallic link 5. Thus, the frequency of microcell oscillator 12 can be brought arbitrarily close to the frequency of base oscillator 1.

Digital controller 13 not only adjusts microcell oscillator 12, but also resets microcell clock 14. Resetting microcell clock 14 may be required in the event of a power failure, or simply to match microcell clock 14 with base clock 2.

Figure 2:
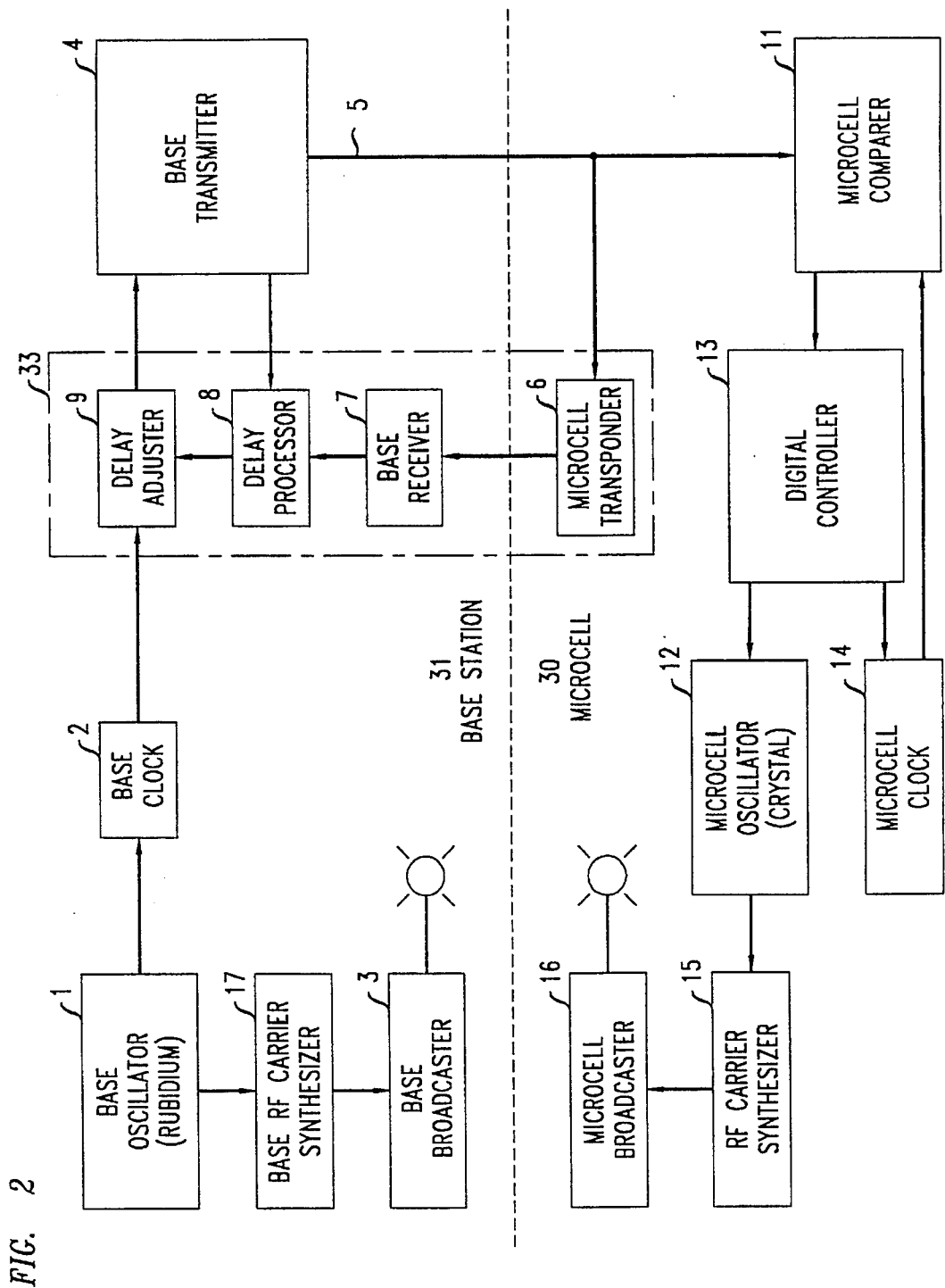
FIG. 2 shows another preferred embodiment which employs a compensation circuit.

FIG. 2 depicts another preferred embodiment of the present invention. This particular embodiment comprises an automatic compensator circuit 33. When the time-of-day signal is sent over metallic link 5, there is a transmission delay before this signal reaches the microcell. This transmission delay is unpredictable due to uncertainties in the configuration of metallic link 5. The embodiment of FIG. 2, however, can overcome this problem.

A base transmitter 4 sends a pulse both to a delay processor 8, and along a metallic link 5 to a microcell transponder 6. Microcell transponder 6 echoes the pulse back to a base receiver 7, and base receiver sends a return signal to delay processor 8. Delay processor 8 measures the time duration between receiving the pulse from base transmitter 4 and receiving the return signal from base receiver 7. Delay processor 8 then divides this time duration in half to arrive at the transmission delay. This calculation represents the time required for a signal sent from base station 31 to reach microcell 30. To compensate for the transmission delay, delay processor 8 sends a delay signal to a delay adjuster 9 which advances the base time-of-day signal before base transmitter 4 transmits it to microcell comparer 11.

Obviously, numerous modifications and variations of the present invention are possible in light of the above teachings. It is therefore understood that within the scope of the appended claims, the invention may be practiced otherwise than as specifically described herein.

What is claimed is:

1. A device for synchronizing the broadcast frequency of a base station and a microcell linked together by a metallic medium, said device comprises:

(a) a base transmitter which transmits a base time-of-day signal to a microcell comparer;

(b) a microcell clock which generates a microcell time-of-day signal, and sends the microcell time-of-day signal to the microcell comparer;

(c) a microcell oscillator which provides said microcell clock with a microcell reference frequency;

(d) the microcell comparer which calculates a time difference between the base time-of-day signal and the microcell time-of-day signal, said microcell comparer outputs a correction signal to a digital controller; and (e) the digital controller which adjusts said microcell oscillator according to the correction signal.

2. The device of claim 1 wherein the correction signal is proportional to a change in the time difference, and wherein said digital controller adjusts said microcell oscillator to maintain a constant time difference.

3. The device of claim 1 wherein said digital controller comprises circuitry to reset said microcell clock in the event of a power failure.

4. The device of claim 1 wherein said digital controller comprises circuitry to periodically reset said microcell clock to match the base time-of-day signal by compensating for the time difference.

5. The device of claim 1 wherein said microcell oscillator comprises a crystal type oscillator.

6. The device of claim 1 further comprising:

(f) a base oscillator which provides a base reference frequency to both a base clock and a base RF carrier synthesizer;

(g) the base clock which receives the base reference frequency from said base oscillator and outputs the base time-of-day signal to said base transmitter; and (h) the base RF carrier synthesizer which receives the base reference frequency from said base oscillator and outputs a base broadcasting signal to a base broadcaster.

7. The device of claim 6 wherein said base oscillator comprises a high stability, rubidium type oscillator.

8. The device of claim 1 further comprising:

(f) an automatic compensating circuit comprising:

(i) a microcell transponder which receives a pulse from said base transmitter and echoes it back to a base receiver (ii) the base receiver which receives the echoed pulse from said microcell transponder, and sends a return signal to a delay processor;

(iii) the delay processor which calculates a time duration between the pulse and the return signal, divides the time duration in half to arrive at a transmission delay, generates a delay signal proportional to the transmission delay, and sends the delay signal to a delay adjuster; and (iv) the delay adjuster which advances the base time-of-day signal to compensate for said transmission delay before said base transmitter transmits the base time-of-day signal to said microcell comparer.

9. The device of claim 8 wherein the correction signal is proportional to the time difference, and wherein said digital controller adjusts said microcell oscillator to reduce the time difference to zero.

10. The device of claim 8 wherein said digital controller comprises circuitry to reset said microcell clock in the event of a power failure.

11. The device of claim 8 wherein said digital controller comprises circuitry to periodically reset said microcell clock to match the base time-of-day signal as modified by said delay adjuster.

12. The device of claim 8 wherein said microcell oscillator comprises a crystal type oscillator.

13. The device of claim 8 further comprising:

(g) a base oscillator which provides a base reference frequency to both a base clock and a base RF carrier synthesizer;

(h) the base clock which receives the base reference frequency from said base oscillator and outputs the base time-of-day signal to said base transmitter through the delay adjuster; and (i) the base RF carrier synthesizer which receives the base reference frequency from said base oscillator and outputs a base broadcasting signal to a base broadcaster.

14. The device of claim 13 wherein said base oscillator comprises a high stability, rubidium type oscillator.

15. A method for synchronizing the broadcast frequency of a base station and a microcell linked together by a metallic medium, said method comprising:

(a) transmitting a base time-of-day signal generated by a base transmitter to a microcell comparer;

(b) sending a microcell time-of-day signal generated by a microcell clock to said microcell comparer;

(c) calculating time difference of the base time-of-day signal with the microcell time-of-day signal by said microcell comparer;

(d) sending a correction signal from said microcell comparer to a digital controller, said correction signal corresponds to a change in the time difference; and (e) adjusting a microcell oscillator by the digital controller to maintain a constant time difference, said microcell oscillator being connected to said microcell clock and the digital controller.

16. The method of claim 15 further comprising:

(f) resetting said microcell clock by said digital controller in the event of a power outage.

17. The method of claim 15 further comprising:

(f) resetting said microcell clock by said digital controller to match the microcell time-of-day signal to the base time-of-day signal while compensating for the time difference.

18. A method for synchronizing the broadcast frequency of a base station and a microcell linked together by a metallic medium, said method comprising:

(a) transmitting a pulse from a base transmitter to a delay processor and a microcell transponder;

(b) echoing the pulse from said microcell transponder back to a base receiver;

(c) measuring a time duration with said delay processor between the pulse from said base transmitter and the pulse return from said microcell transponder through said base receiver, wherein said time duration is forwarded to from said delay processor to a delay adjuster (d) calculating transmission delay by said delay processor by dividing the time duration in half;

(e) sending a delay signal from said delay processor to said delay adjuster, the delay signal corresponds to transmission delay;

(f) advancing a base time-of-day signal by said delay adjuster to compensate for the transmission delay before the base transmitter transmits the base time-of-day signal to a microcell comparer;

(g) sending a microcell time-of-day signal generated by a microcell clock to said microcell comparer;

(h) calculating time difference of the base time-of-day signal with the microcell time-of-day signal by said microcell comparer;

(i) sending a correction signal from said microcell comparer to a digital controller, said correction signal corresponds to correction necessary to reduce the time difference to zero; and (j) adjusting a microcell oscillator by the digital controller to reduce the time difference to zero, said microcell oscillator being connected to said microcell clock and the digital controller.

19. The method of claim 18 further comprising:
(k) resetting said microcell clock by said digital controller in the event of a power outage.

20. The method of claim 18 further comprising:
(k) resetting said microcell clock by said digital controller to match the microcell time-of-day signal to the base time-of-day signal as modified by said delay adjuster.

* * * * *